US012812827B2

(12) United States Patent
Kendzia, III et al.

(10) Patent No.: US 12,812,827 B2
(45) Date of Patent: Nov. 24, 2026

(54) METHOD AND SYSTEM FOR CONTROLLED AIRFLOW COOLING

(71) Applicant: ABB Schweiz AG, Baden (CH)

(72) Inventors: Thomas A. Kendzia, III, Rockville, VA (US); Christopher A. Belcastro, Mechanicsville, VA (US); Gilbert T. Miller, Henrico, VA (US)

(73) Assignee: ABB Schweiz AG, Baden (CH)

( * ) Notice: Subject to any disclaimer, the term of this patent is extended or adjusted under 35 U.S.C. 154(b) by 359 days.

(21) Appl. No.: 18/535,763

(22) Filed: Dec. 11, 2023

(65) Prior Publication Data

US 2025/0194060 A1 Jun. 12, 2025

(51) Int. Cl.
*H05K 7/20* (2006.01)
*F04D 27/00* (2006.01)

(52) U.S. Cl.
CPC ....... *H05K 7/20945* (2013.01); *F04D 27/004* (2013.01); *H05K 7/20909* (2013.01)

(58) Field of Classification Search
CPC ............ H05K 7/20909; H05K 7/20945; F04D 27/004
USPC .......................................................... 454/184
See application file for complete search history.

(56) References Cited

U.S. PATENT DOCUMENTS 8,310,829 B2 * 11/2012 Monk ................ H05K 7/20745 361/695
11,690,195 B2 * 6/2023 Kendzia, III ...... H05K 7/20154 361/679.48
2005/0219825 A1 10/2005 Campini et al.
2009/0097203 A1 * 4/2009 Byers ................ H05K 7/20572 361/695
2014/0138068 A1 5/2014 Nienberg et al.

FOREIGN PATENT DOCUMENTS

WO WO 2022/022793 A 2/2022

OTHER PUBLICATIONS

European Patent Office, International Search Report in International Patent Application No. PCT/IB2024/062452, 5 pp. (Apr. 7, 2025).
European Patent Office, Written Opinion in International Patent Application No. PCT/IB2024/062452, 14 pp. (Apr. 7, 2025).

* cited by examiner

*Primary Examiner* — Vivek K Shirsat
(74) *Attorney, Agent, or Firm* — Fitch Even Tabin & Flannery LLP

(57) ABSTRACT

A system for one or more functional blocks of a power system includes: one or more dampers each connected to at least one of the one or more functional blocks of the power system; a pressurized intake plenum comprising one or more walls and one or more openings, the one or more dampers aligned with the one or more openings; one or more intake fans in communication with the pressurized intake plenum and the one or more walls of the pressurized intake plenum; a system control, wherein the one or more intake fans are configured to force cooling air through the pressurized intake plenum and the one or more functional blocks of the power system via the one or more dampers, wherein the system control is configured to send signals to the one or more intake fans to change a speed of the one or more intake fans.

14 Claims, 13 Drawing Sheets

| Damper | | Operating Mode | | |
|---|---|---|---|---|
| # | Function | Normal | Charging | Battery |
| 1 | Rectifier | $X_{rect}$ | $X_{rect}'$ | $X_{rect}''$ |
| 2 | Inverter | $X_{inv}$ | $X_{inv}'$ | $X_{inv}''$ |
| 3 | Booster | $X_{boost}$ | $X_{boost}'$ | $X_{boost}''$ |

METHOD AND SYSTEM FOR CONTROLLED AIRFLOW COOLING

FIELD

The present disclosure relates to a method and system for controlled airflow cooling.

BACKGROUND

Data centers and other similar facilities require secure, stable, and adequate amounts of electricity to maintain their information technology (IT) resources and components. Electricity power surges, sags, and outages however can damage the valuable IT resources and components within these facilities as well as halt production. Operators of such data centers or other facilities which require large amounts of power require certain power protection systems, such as an uninterruptible power system (UPS). UPSs provide power condition and backup power when utility power fails in facilities to allow critical equipment to shut down smoothly. UPSs may employ other mechanisms, such as generators, to provide a secondary alternating current (AC) source. UPSs also condition incoming power so that sags and surges don't damage sensitive components or resources. Different types of UPSs exist each with different pros, cons, and costs.

Although UPSs may provide a way for facilities to enable a protection system for their components, UPSs are not without problems. For example, for large UPS systems that include multiple functional blocks that are parallel for capacity, the amount of fans required to cool the components of the UPSs may be large thereby increasing costs. Moreover, providing redundancy in such systems can require a doubling of the number of fans. This can require the fans to be stacked thus increasing the footprint of the UPS.

Moreover, conventional cooling mechanisms for UPSs introduce complicated control schemes that need to balance power demand vs. cooling needs. Cooling systems associated with UPSs may utilize a singular control system which may lock or fail which results in the cooling system not having a way to compensate for the failure or locking of components.

Conventional cooling architectures also require fans to be directly adjacent to a corresponding functional block or individual ducting for each cooling circuit which exacerbates the issues noted above. Alternative cooling systems may use a singular large fan for all the functional blocks of a UPS which may reduce the overall number of fans in the system but must be oversized to account for airflow through inactive functional blocks. Additionally, the cooling provided by one large oversized fan cannot be granularly controlled.

SUMMARY

An embodiment of the present disclosure provides a controlled cooling system for one or more functional blocks of a power system that includes: one or more dampers that are each connected to at least one of the one or more functional blocks of a power system; a pressurized intake plenum comprising one or more walls and one or more openings, the one or more dampers aligned with the one or more openings; one or more intake fans in communication with the pressurized intake plenum and the one or more walls of the pressurized intake plenum; and a system control, wherein the one or more intake fans are configured to force cooling air through the pressurized intake plenum and the one or more functional blocks of the power system via the one or more dampers. The system control is configured to send signals to the one or more intake fans to change a speed of the one or more intake fans.

The system of an embodiment may further include a fan control system and a flow control system, wherein the fan control system is configured to communicate with the one or more intake fans and control a current speed of the one or more intake fans based on the signals between the one or more intake fans, the system control, and the fan control system.

In an embodiment, the flow control system is configured to communicate with the one or more dampers, wherein the flow control system is configured to communicate with the one or more dampers and control a current position of the one or more dampers based on the signals between the one or more dampers, the system control, and the flow control system.

In an embodiment, the system control, fan control system, and flow control system receive from the one or more intake fans, the one or more dampers, or the one or more functional blocks of the power system an operating mode of the one or more functional blocks, a temperature associated with the one or more functional blocks, a load level of the one or more functional blocks, a current speed of the one or more fans, and a current position of the one or more dampers.

In an embodiment, the system control or the flow control system update the current position of the one or more dampers to a greater degree of opening in response to the signals from the fan control system indicating a failure of one of the one or more intake fans.

In an embodiment, the system control or the flow control system update the current position of the one or more dampers to a greater degree of opening in response to not receiving the signals from the fan control system.

In an embodiment, the system control or the fan control system update the current speed of the one or more intake fans to increase the speed of the one or more intake fans in response to the signals from the flow control system indicating a failure of one of the one or more dampers.

In an embodiment, the system control or the fan control system update the current speed of the one or more intake fans to increase the speed of the one or more intake fans in response to not receiving the signals from the flow control system.

In an embodiment, the power system is an uninterruptible power system (UPS), and wherein the one or more functional blocks include at least a rectifier, inverter, and booster.

The system of an embodiment may further include one or more ducts in communication with the one or more dampers and the one or more functional blocks, the one or more ducts located in between the one or more dampers and the one or more functional blocks.

The system of an embodiment may further include one or more ducts in communication with the one or more dampers and the pressurized intake plenum, the one or more ducts located in between the one or more dampers and the pressurized intake plenum.

The system of an embodiment may further include one or more fan control systems and one or more flow control systems, wherein the one or more fan control systems are configured to communicate with the one or more intake fans and control a current speed of the one or more intake fans based on the signals between the one or more intake fans, the system control, and the one or more fan control systems.

In an embodiment, the one or more flow control systems are configured to communicate with the one or more dampers, wherein the one or more flow control systems are configured to communicate with the one or more dampers and control a current position of the one or more dampers based on the signals between the one or more dampers, the system control, and the one or more flow control systems.

Another embodiment of the present disclosure provides a controlled cooling system for one or more functional blocks of a power system including: one or more dampers each connected to at least one of the one or more functional blocks of the power system; a pressurized exhaust plenum comprising one or more walls and one or more openings, the one or more dampers aligned with the one or more openings; one or more exhaust fans in communication with the pressurized exhaust plenum and the one or more walls of the pressurized exhaust plenum; and a system control, wherein the one or more exhaust fans are configured to pull cooling air through the pressurized exhaust plenum and the one or more functional blocks of the power system via the one or more dampers, and force warm air out of the pressurized exhaust plenum. The system control is configured to send signals to the one or more exhaust fans to change a speed of the one or more exhaust fans.

The system of an embodiment may further include a fan control system and a flow control system, wherein the fan control system is configured to communicate with the one or more exhaust fans and control a current speed of the one or more exhaust fans based on the signals between the one or more exhaust fans, the system control, and the fan control system.

In an embodiment, the flow control system is configured to communicate with the one or more dampers, wherein the flow control system is configured to communicate with the one or more dampers and control a current position of the one or more dampers based on the signals between the one or more dampers, the system control, and the flow control system.

In an embodiment, the power system is a semiconductor switch, and wherein the one or more functional blocks include a source alternating current (AC) switch.

The system of an embodiment may further include one or more ducts in communication with the one or more dampers and the one or more functional blocks, the one or more ducts located in between the one or more dampers and the one or more functional blocks.

The system of an embodiment may further include one or more ducts in communication with the one or more dampers and the pressurized exhaust plenum, the one or more ducts located in between the one or more dampers and the pressurized exhaust plenum.

Another embodiment of the present disclosure provides a computer-implemented method, including: receiving, by a control system of a power system, signals from a fan control system and a flow control system, the control system configured to communicate with one or more intake fans and one or more dampers, the one or more intake fans in communication with a pressurized intake plenum, the pressurized intake plenum comprising one or more walls and one or more openings, the one or more dampers each connected to at least one of the one or more functional blocks and aligned with the one or more openings, wherein the one or more intake fans are configured to force cooling air through the pressurized intake plenum and the one or more functional blocks of the power system via the one or more dampers; comparing, by the control system, a temperature included in the signals to a threshold temperature; and adjusting, by the control system via instructions transmitted to the fan control system and the flow control system, a current speed of the one or more intake fans and a current position of the one or more dampers based on the temperature exceeding the threshold temperature.

BRIEF DESCRIPTION OF THE DRAWINGS

The present disclosure will be described in even greater detail below based on the exemplary figures. The disclosure is not limited to the exemplary embodiments. All features described and/or illustrated herein can be used alone or combined in different combinations in embodiments of the disclosure. The features and advantages of various embodiments of the present disclosure will become apparent by reading the following detailed description with reference to the attached drawings which illustrate the following.

Figure 10A:
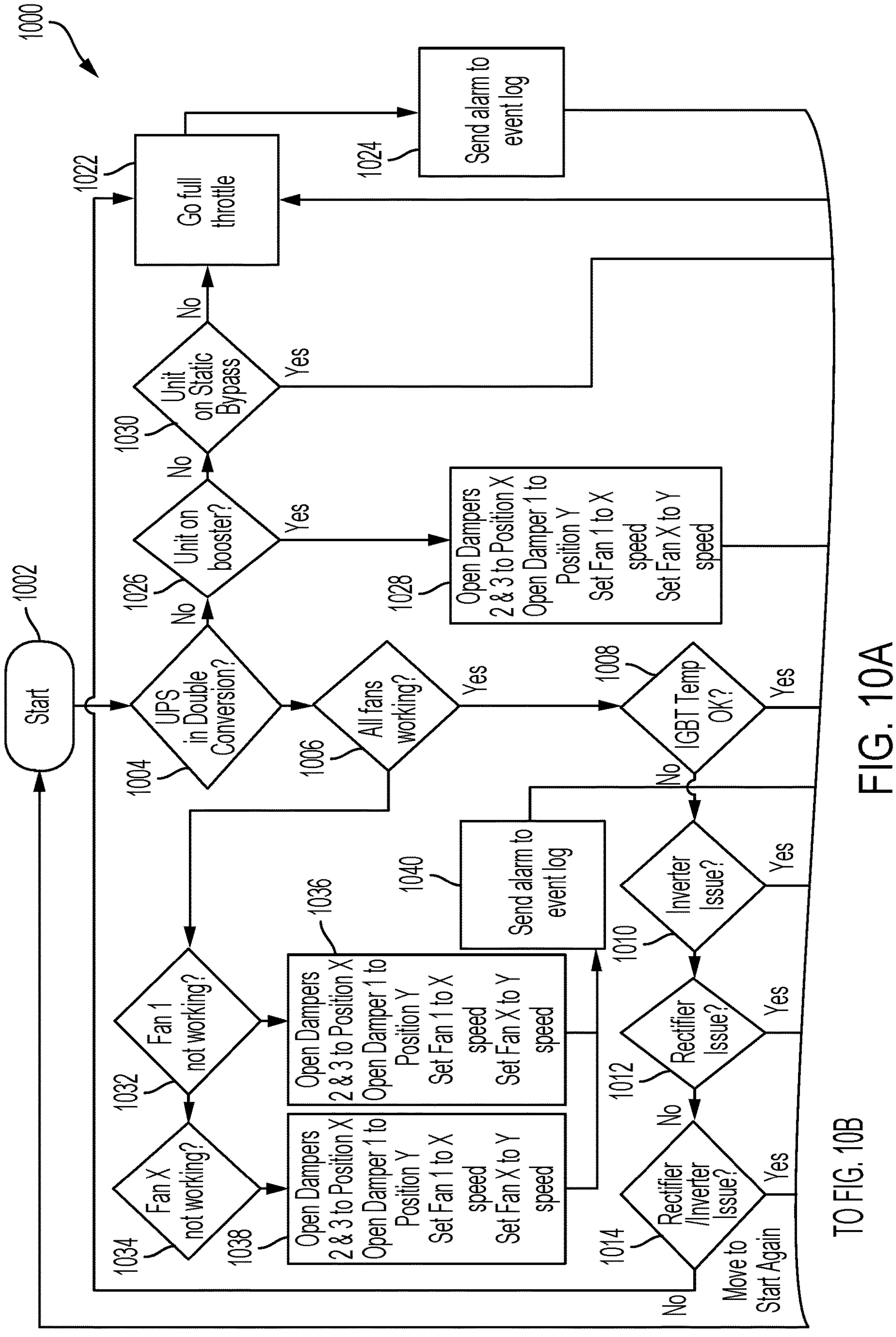
Figure 10B:
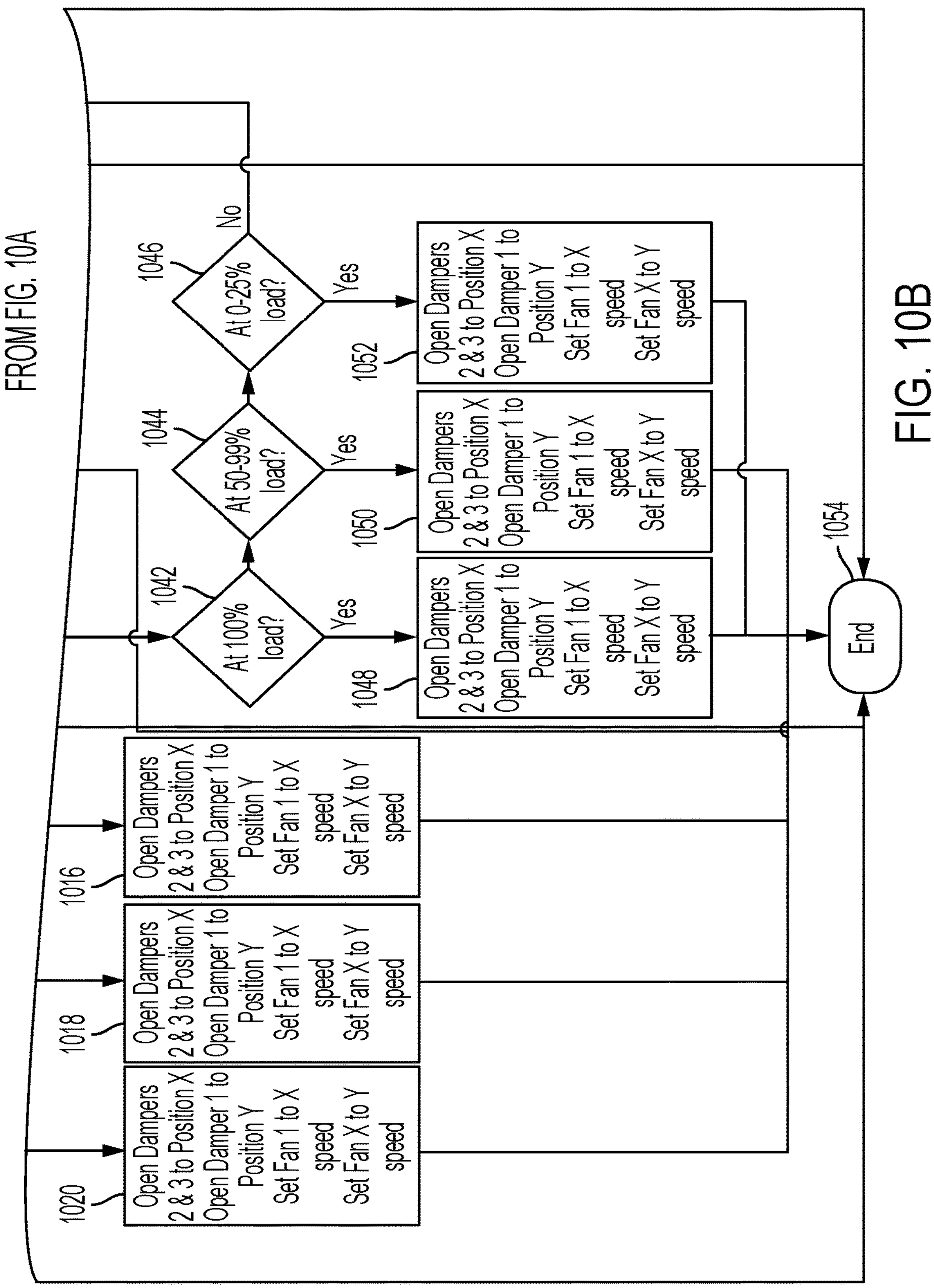
Figure 11:
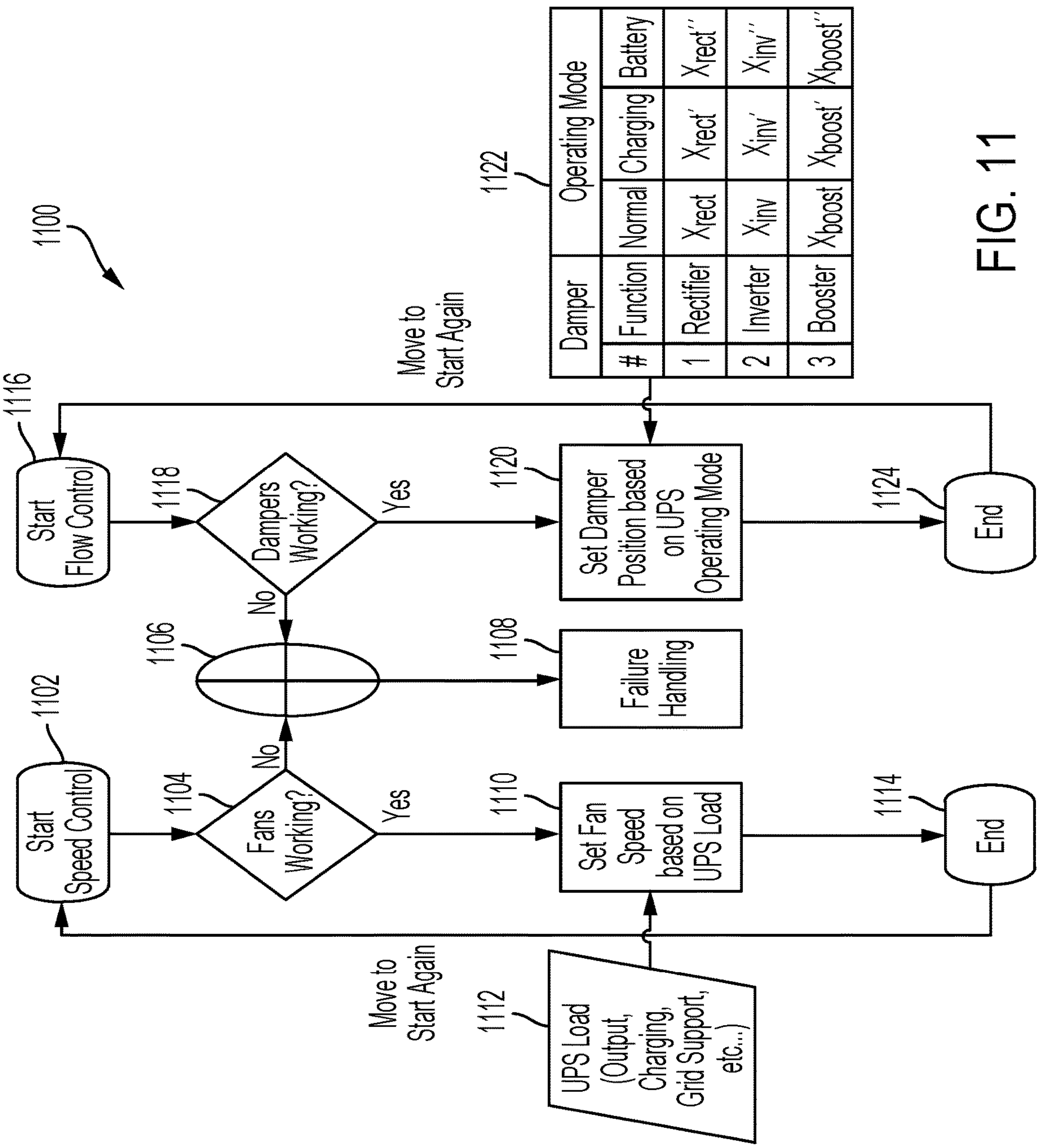
Figure 12:
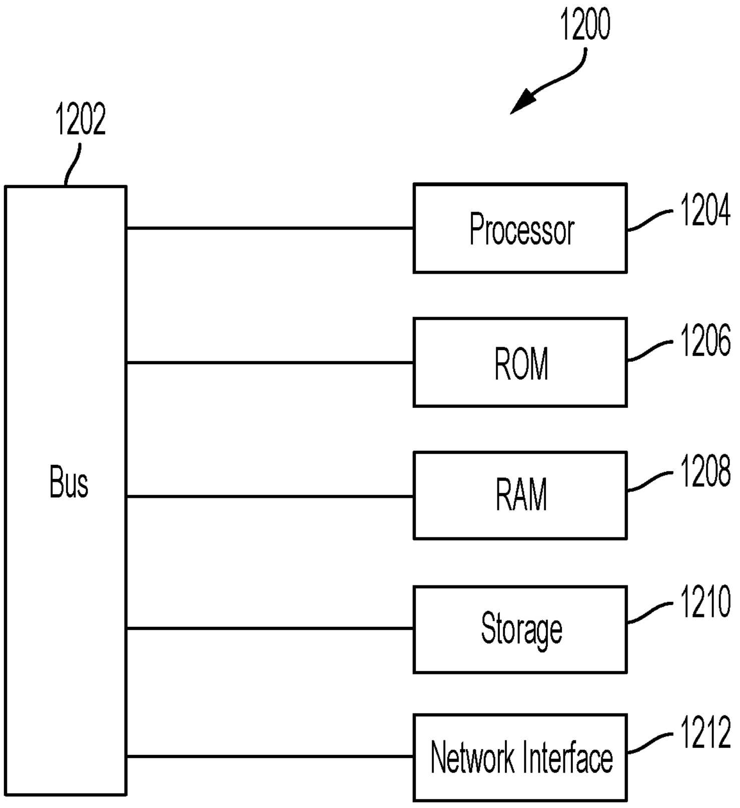

FIGS. **10*a* and 10*b*** illustrate an example process for providing cooling using the controlled airflow cooling mechanisms described herein with a UPS as well as responding to failures in components of the cooling system according to an embodiment of the present disclosure;

FIG. 11 illustrates an example process for providing cooling using the controlled airflow cooling mechanisms described herein with a UPS as well as responding to failures in components of the cooling system according to an embodiment of the present disclosure; and FIG. 12 illustrates a simplified block diagram of one or more devices or systems within exemplary cooling systems of FIGS. 1-11 according to embodiments of the present disclosure.

DETAILED DESCRIPTION

Embodiments of the present disclosure provide a method and system for controlled airflow cooling of components. While the present disclosure is described primarily in connection with UPSs or semiconductor switches, such as static transfer switches (STSs), as would be recognized by a person of ordinary skill in the art, the disclosure is not so limited and inventive features apply to other components or systems which require controlled airflow cooling.

According to aspects of the present disclosure, a novel cooling system is described which provides solutions to problems associated with conventional cooling systems for UPSs or semiconductor switches. For example, the cooling system described herein provides an architecture which enables the overall number of fans required to achieve cooling needs for components of a UPS or semiconductor switch to be reduced while still allowing for cooling to be focused or controlled on active functional blocks. In an exemplary embodiment, the system provides independent control for components such as dampers and fans such that one can compensate if the other one fails. Further, the system provides for greater redundancy of fans via the use of the plenum in the cooling system as described herein. Greater flexibility of component placement within cooling systems is also achieved as exemplary embodiments do not require individual ducts.

As such, the present disclosure enables a highly customizable and flexible cooling system that can provide controlled airflow cooling to multiple systems such as UPSs or semiconductor switches while solving problems typically associated with cooling systems associated with such systems. Not only does this novel mechanism provide practical benefits to operators of facilities which utilize UPSs or semiconductor switches (e.g., data centers)—such as, enabling labor- and cost-effective installation and upgrades to cooling systems as well as reducing the foot print of cooling systems within said facilities, but it also provides technical improvements over conventional cooling architectures and systems. For example, embodiments of the present disclosure enable more reliable redundancy to be introduced to cooling systems, granular airflow control to components which require cooling, and faster response times to failures in components of the cooling systems compared to conventional cooling systems.

FIGS. 1-9 include solid arrows and dashed line arrows. The solid arrows represent the direction and provisioning of cool air while the dashed line arrows represent the direction and the exhausting of warm or hot air. UPSs may include components such as a rectifier 102, inverter 104, and booster 106. The UPSs represented in FIGS. 1-7 are examples of double-conversion systems. Although these figures are described with reference to double-conversion UPSs the embodiments described herein are not limited to interacting or providing cooling to only double-conversion UPSs. The novel cooling systems described herein may provide controlled airflow cooling for single-conversion UPS systems, standby UPS systems, line-interactive UPS systems, and any other suitable multi-mode systems.

A double-conversion UPS may convert power twice by using an input rectifier (rectifier 102) which converts AC power into direct current (DC) power and feeds it to an output inverter (inverter 104). The output inverter (inverter 104) may convert the power back to AC power before sending it on to components such as a server rack. A double-conversion UPS may, in normal operation, process power twice. However, if an AC input supply falls out of a range of predefined limits, the rectifier 102 may shut off and the inverter 104 may continue to operate as normal but draw power from a battery instead. The booster 106 may be used to power the battery or otherwise interact with the battery to provide power to the inverter 104. UPSs may also utilize a bypass path that uses an unconditioned AC power source to support loads to components of a facility should the UPS fail.

Figure 1:
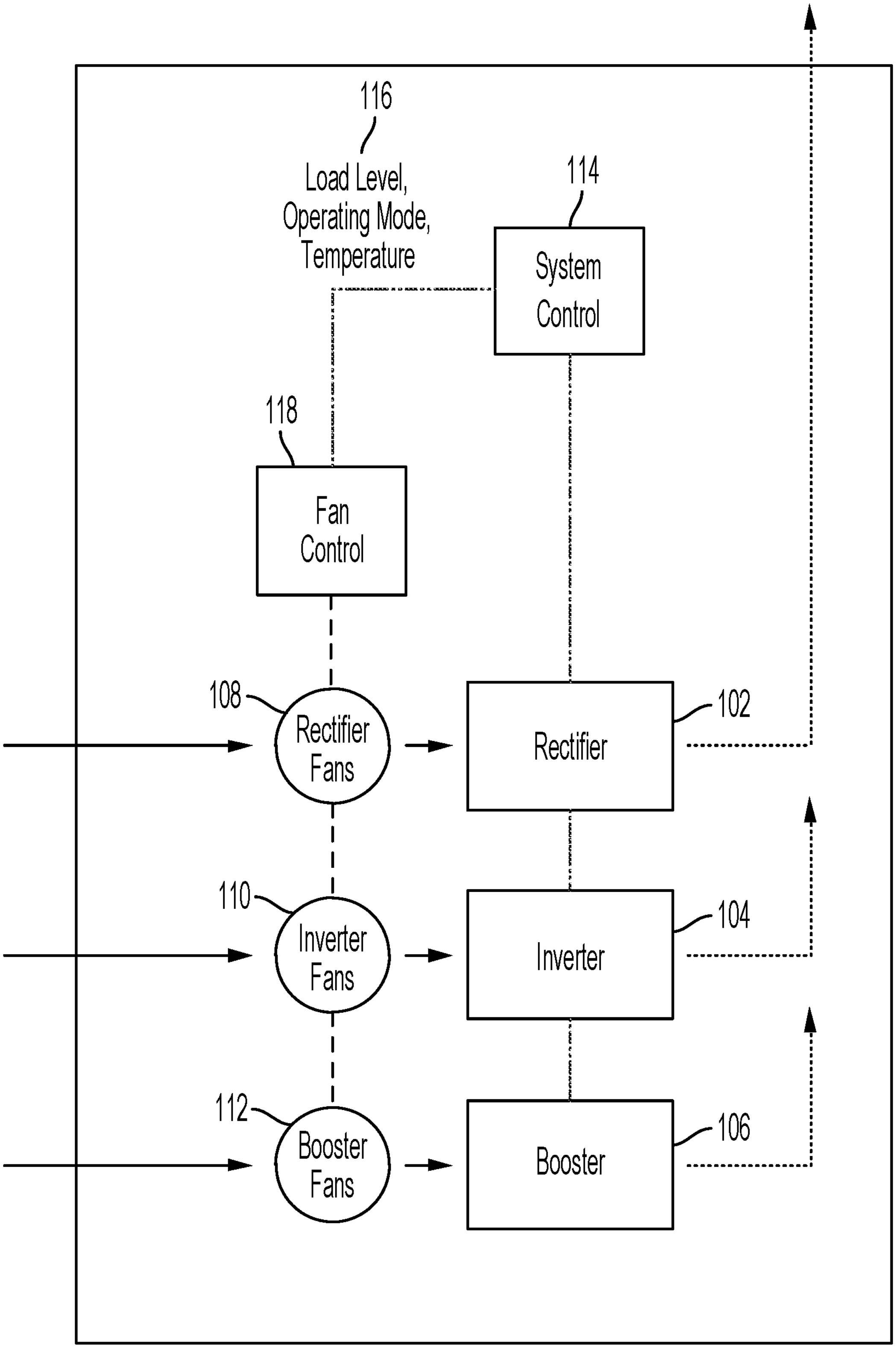
FIG. 1 illustrates a conventional cooling architecture for cooling a UPS.

FIG. 1 illustrates a conventional cooling architecture for cooling a UPS. As illustrated in FIG. 1, conventional cooling systems may include one or more fans that are each tied to a particular component of a UPS. For example, FIG. 1 depicts rectifier fans 108, inverter fans 110, and booster fans 112. As illustrated in FIG. 1, each fan (108-112) is responsible for providing cool air to each associated component of the UPS (e.g., rectifier fans 108 provide cool air to the rectifier 102, inverter fans 110 provide cool air to inverter 104, etc.). The conventional cooling system depicted in FIG. 1 illustrates the limitations on providing redundancy as adding more fans creates a larger footprint for the cooling system and/or UPS within a facility. Further, adding more rectifier fans 108 does nothing to help the inverter 104 should the inverter fans 110 fail. The conventional cooling system of FIG. 1 includes a system control 114 that communicates a load level, operating mode, and temperature 116 to fan control 118. Sensors associated with the rectifier 102, inverter 104, booster 106, or their associated fans 108-112 may provide signals or other data/information to the system control 114 which include the load level, operating mode, or temperature 116. The fan control 118 may be configured to update or set a fan mode or speed for each fan 108-112 in response to information, signals, or instructions from system control 114. As depicted in FIG. 1, should the fan control 118 fail or the system control 114 be unable to communicate with the fan control 118 no other redundancy is available within the conventional cooling system illustrated in FIG. 1 to account for such failures.

Figure 2:
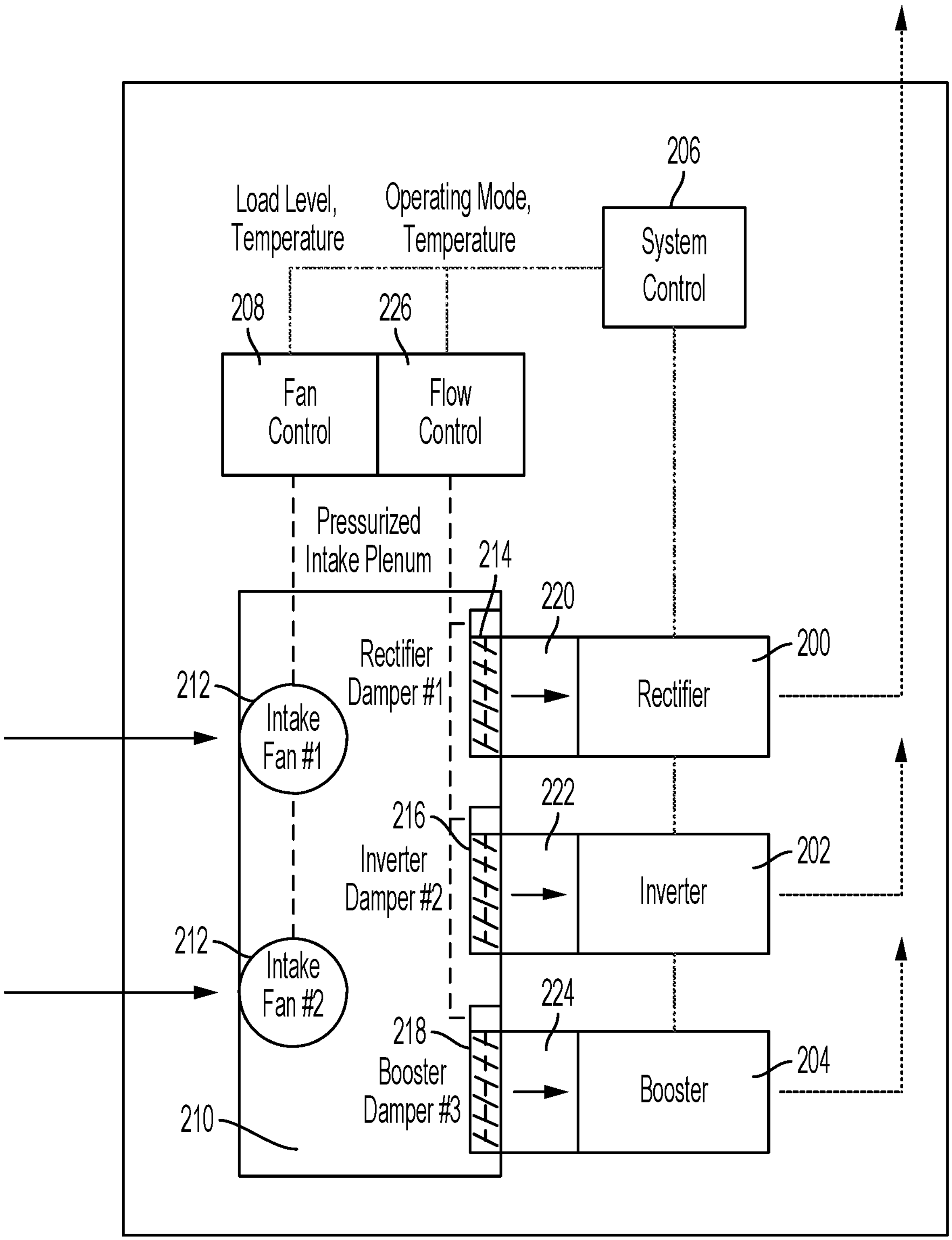
FIG. 2 illustrates an example architecture for controlled airflow cooling that includes a pressurized intake plenum, intake fans, and ducts located between a damper component of the cooling system and functional blocks of a UPS according to an embodiment of the present disclosure.

FIG. 2 illustrates an example architecture for controlled airflow cooling that includes a pressurized intake plenum, intake fans, and ducts located between a damper component of the cooling system and functional blocks of a UPS according to an embodiment of the present disclosure. The architecture depicted in FIG. 2 includes some components of a UPS similar to those described in FIG. 1 including a rectifier 200, an inverter 202, booster 204, system control 206, and fan control (fan control system) 208. The novel architecture and cooling system depicted in FIG. 2 includes several more components than the conventional architecture illustrated in FIG. 1. For example, FIG. 2 depicts a pressurized intake plenum 210, one or more intake fans 212, dampers 214-218, ducts 220-224, and flow control (flow control system) 226. Dampers 214-218 may each be associated with a particular component of a UPS, such as damper 214 being a rectifier damper, damper 216 being an inverter damper, and damper 218 being a booster damper 218. A damper (e.g., dampers 214-218) as used herein refers to a valve or plate that regulates airflow to components by opening or closing to various degrees. Opening or closing to various degrees may be referred to as updating or changing a position of the dampers.

As depicted in FIG. 2, the fans (212) are not associated with a particular UPS component such as rectifier 200 or inverter 202 in contrast to the cooling system depicted in FIG. 1. Instead, the intake fans 212 are configured to intake cool air and provision it via dampers 214-218 and ducts 220-224 to the various components of the UPS (e.g., rectifier 200, inverter 202, and booster 204). The pressurized intake plenum 210 may represent a component for circulating air, such as cool air provisioned or communicated via intake fans 212 to the UPS components 200-204 via dampers 214-218 and ducts 220-224. The pressurized intake plenum 210 may include one or more walls and openings for providing air flow communication between the housing of the cooling system and the components of the UPS (e.g., 200, 202, and 204). The intake fans 212 may force air flow into the pressurized intake plenum 210. In some embodiments the cooling system of the current disclosure may utilize exhaust fans which force air flow out of a plenum as described below.

The architecture and systems depicted in FIG. 2 allow for greater redundancy and control in contrast to conventional cooling systems. For example, flow control 226 may be configured to communicate signals to and from the various dampers (214-218) which result in changes to the air flow and cooling provided to components 200-240. Additionally, the flow control 226 may granularly control each damper independently of the other dampers. For example, in response to temperature information from the inverter 202 being provided to the system control 206 and/or the flow control 226, and indicating a high temperature (e.g., a temperature exceeding a certain threshold temperature associated with the inverter 202), the flow control 226 and/or the system control 206 may respond. For example, the flow control 226 and/or the system control 206 may instruct the inverter damper 216 to open to greater degree than a current opening degree thereby allowing more cool air flow to be provided via intake fans 212 and pressurized intake plenum 210 to be provided to the inverter 202 and lower the temperature for inverter 202.

Similarly, the intake fans 212 may be controlled and/or provide information to fan control 208 and system control 206. The fan control 208 and/or system control 206 may provide instructions to increase or decrease the speed of the intake fans thereby generating more or less air flow being provisioned to the components 200-204. In embodiments, the system control 206 may be configured to utilize various data and information from the components of the UPS 200-204 and from the cooling system (212, 214-218, 208, and 226) to compare to one or more thresholds, which results in responses by the components of the cooling system according to instructions generated and transmitted to the flow control 226, fan control 208, or directly to the intake fans 212 or dampers 214-218. For example, the system control 206, fan control 208, and flow control 226 may receive and transmit information or data such as operating mode of the components 200-204 or intake fans 212 and dampers 214-218, temperature of components such as rectifier 200, inverter 202, or booster 204, load level of components 200-204, or temperatures of fans 212, pressurized intake plenum 210, or dampers 214-218. Redundancy is also achieved or further fail safes are accomplished in the cooling system of FIG. 2 because if one of the intake fans 212 fails the other intake fan can still provide sufficient air flow through the pressurized intake plenum 210 and to the components 200-204 via dampers 214-218 and ducts 220-224. In scenarios where the fan control 208 fails or locks in a certain state or mode, the system control 206 and flow control 226 may adjust the dampers 214-218 to allow for sufficient cooling of components 200-204. The novel cooling system described herein can be installed with a plurality of fans which correspond to different redundancy scenarios such as n+2, 2n, n+3, etc. According to embodiments described herein, the footprint of the cooling system can be flexible according to the size requirements of the facility or of the associated component that will be cooled such as various sized UPSs or semiconductor switches.

Figure 3:
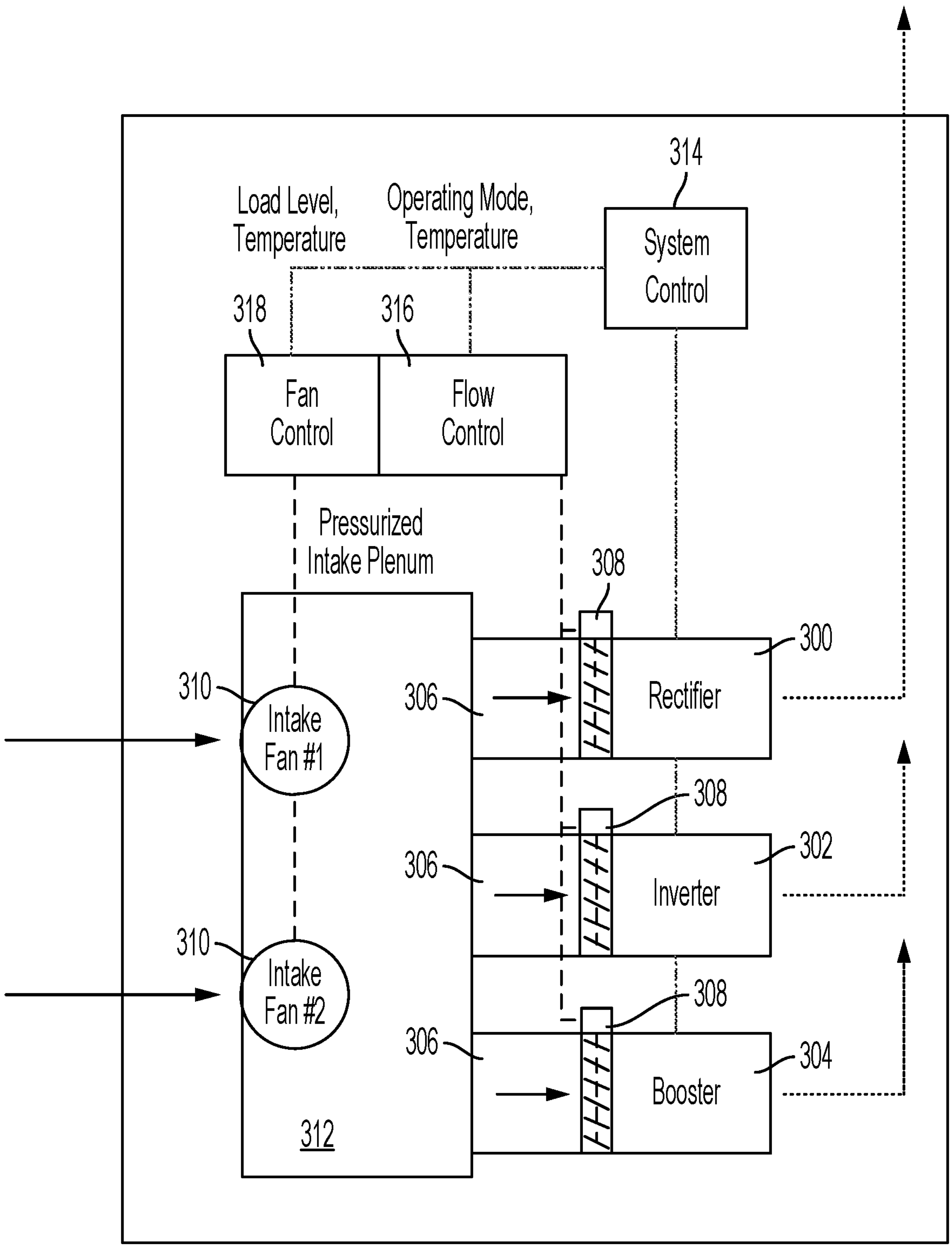
FIG. 3 illustrates an example architecture for controlled airflow cooling that includes a pressurized intake plenum, intake fans, and ducts located between the pressurized intake plenum and a damper component of the cooling system according to an embodiment of the present disclosure.

FIG. 3 illustrates an example architecture for controlled airflow cooling that includes a pressurized intake plenum, intake fans, and ducts located between the pressurized intake plenum and a damper component of the cooling system according to an embodiment of the present disclosure. The example architecture of FIG. 3 includes components of a cooling system interacting with a double-conversion UPS similar to FIG. 2 including rectifier 300, inverter 302, booster 304, ducts 306, dampers 308, intake fans 310, pressurized intake plenum 312, system control 314, flow control 316, and fan control 318. In the configuration depicted in FIG. 3 the flow control 316 may communicate with dampers 308 located between ducts 306 and components 300, 302, and 304. Fine-tuned control can be achieved by the intake fans 310 forcing cool air into the pressurized intake plenum 312 and to the components 300-304 via ducts 306 and dampers 308. For example, the flow control 316 may communicate with each damper 308, individually, to provide more or less air flow to a corresponding component of the UPS (e.g., 300-304). Operating modes, temperatures, and other suitable signals, data, or information from dampers 308 may be communicated to the flow control 316 and/or system control 314 for modifying the air flow provided to components 300-304. The cooling system architecture depicted in FIG. 3 again provides redundancy should one of the intake fans 310 fail or the fan control 318 becomes unresponsive. In such a scenario the flow control 316 and/or system control 314 may provide instructions to open dampers 308 to a greater degree such that the air flow to components 300-304 is increased.

Figure 4:
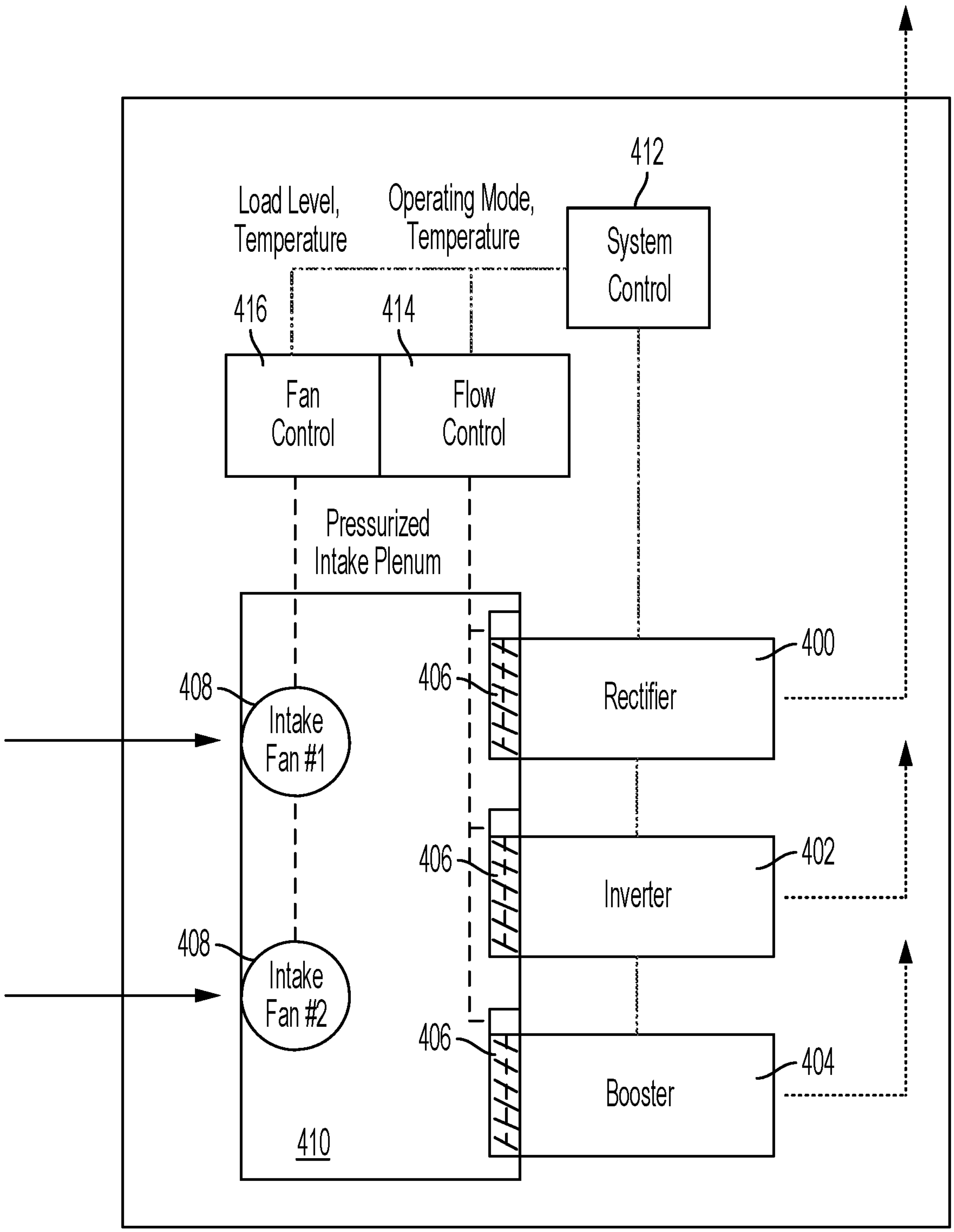
FIG. 4 illustrates an example architecture for controlled airflow cooling that includes a pressurized intake plenum and intake fans according to an embodiment of the present disclosure.

FIG. 4 illustrates an example architecture for controlled airflow cooling that includes a pressurized intake plenum and intake fans according to an embodiment of the present disclosure. The example architecture of FIG. 3 includes components of a cooling system interacting with a double-conversion UPS similar to FIG. 2 including rectifier 400, inverter 402, booster 404, dampers 406, intake fans 408, pressurized intake plenum 410, system control 412, flow control 414, and fan control 416. The cooling system architecture depicted in FIG. 4 does not include ducts as in FIGS. 2 and 3. Yet the system is still able to provide cool air flow to components 400-404 via intake fans 408, pressurized intake plenum 410, and dampers 406. The cooling system depicted in FIG. 4 includes dampers 406 located next to the pressurized intake plenum 410 wall and a component of the UPS (e.g., 400-404). Each damper 406 may be used to provide more fine-tuned control of the air flow provided to a corresponding component (400-404) by opening or closing an individual damper 406 to a greater or lesser degree than a current degree.

In embodiments, temperature sensors may be associated with the intake fans 408, dampers 406, the pressurized intake plenum 410, and/or the components 400-404 of the UPS or semiconductor switch. The system control 412, fan control 416, and/or the flow control 414 may compare the temperatures received from the temperature sensors to one or more threshold temperatures and respond by providing more or less air flow to certain components by at least: updating the speed of rotation of intake fans 408; and/or closing or opening the dampers 406 to a greater or lesser degree. Separate temperature thresholds may be maintained and compared for the intake fans 408, dampers 406, the pressurized intake plenum 410, and/or the components 400-404. For example, a temperature threshold for dampers 406 may be greater than a temperature threshold for the intake fans 408.

Figure 5:
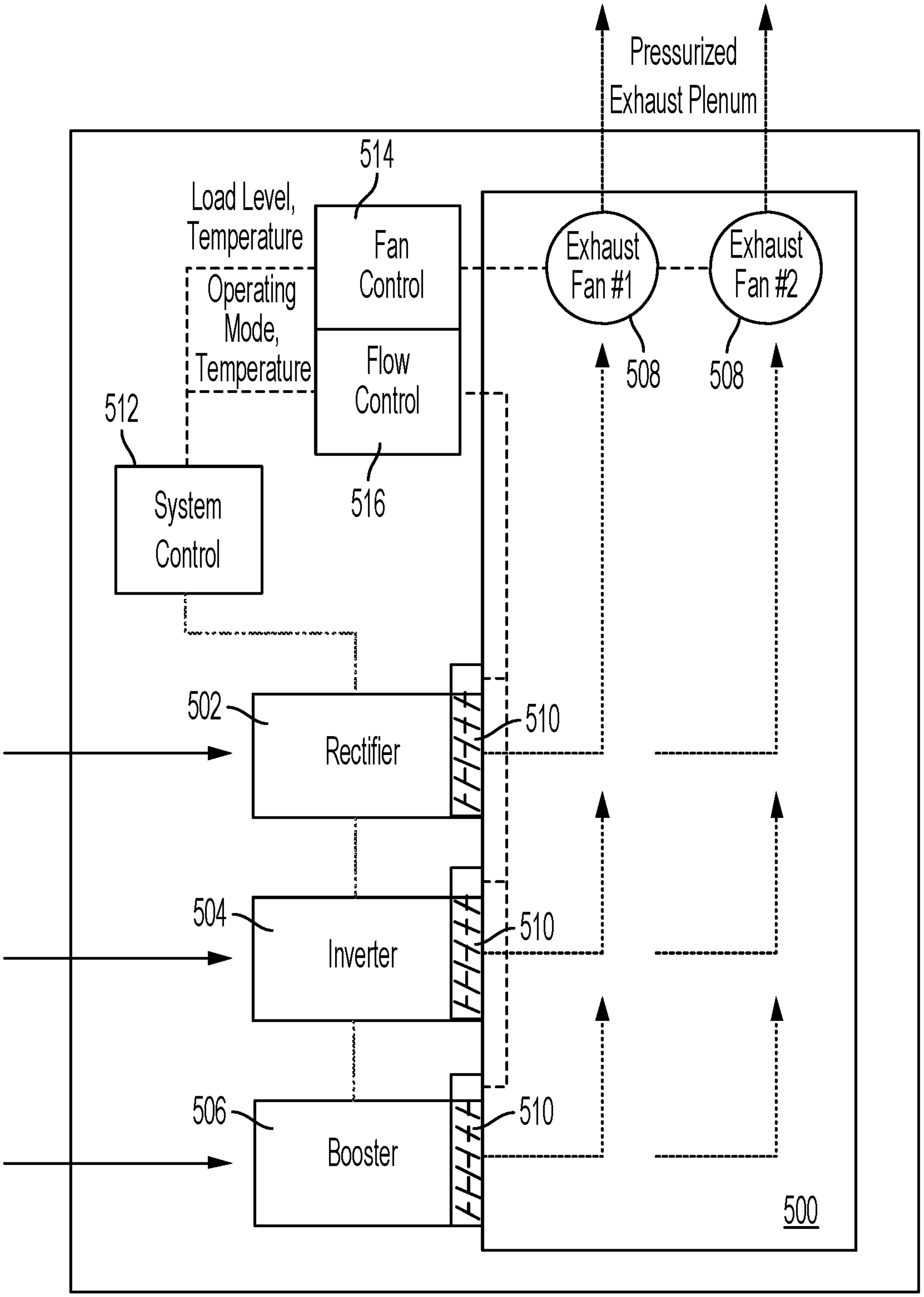
FIG. 5 illustrates an example architecture for controlled airflow cooling that includes a pressurized exhaust plenum, exhaust fans, and damper components of the cooling system connected to the pressurized exhaust plenum according to an embodiment of the present disclosure.

FIG. 5 illustrates an example architecture for controlled airflow cooling that includes a pressurized exhaust plenum, exhaust fans, and damper components of the cooling system connected to the pressurized exhaust plenum according to an embodiment of the present disclosure. The cooling system depicted in FIG. 5 includes a pressurized exhaust plenum 500 that pulls cool air through the UPS components (e.g., rectifier 502, inverter 504, and booster 506) and forces the warm air out of the pressurized exhaust plenum 500 via exhaust fans 508. The cooling system depicted in FIG. 5 also includes dampers 510, system control 512, fan control 514, and flow control 516. In embodiments, a cooling system that utilizes the architecture depicted in FIG. 5 can still provide controlled cooling to components 502-506 of a UPS via interacting with exhaust fans 508 and dampers 510. Similar to other architectures described herein with similar components, the system control 512 and fan control 514 can change the speed or operating mode of exhaust fans 508 thereby reducing the air flow provided to components 502-506.

The system control 512 and/or flow control 516 can further restrict or provide more air flow to components 502-506 by opening or closing dampers 510 to a greater or lesser degree than a current degree in response to information from components 502-506, 508, 510, or sensors associated with each of these components. Redundancy for the components of the cooling system depicted in FIG. 5 can be achieved by the exhaust fans 508 still being able to pull cool air through the components 502-506 and force the warm or hot air out of the pressurized exhaust plenum 500 if one of the exhaust fans 508 were to fail. Moreover, if fan control 514 or the exhaust fans 508 were to be locked in a certain mode or cease to be able to communicate with system control 512, the flow control 516 and/or system control 512 can respond by opening the dampers 510 to a greater degree than a current degree to provide more cool air flow to components 502-506. Similarly, if dampers 510 and/or flow control 516 were locked into a certain mode or cease to be able to communicate with system control 512, the fan control 514 and/or system control 512 can increase a fan speed for the exhaust fans 508 thereby pulling more cool air flow through components 502-506 and warm air out of the pressurized exhaust plenum 500 thus providing greater cooling to components 502-506.

Figure 6:
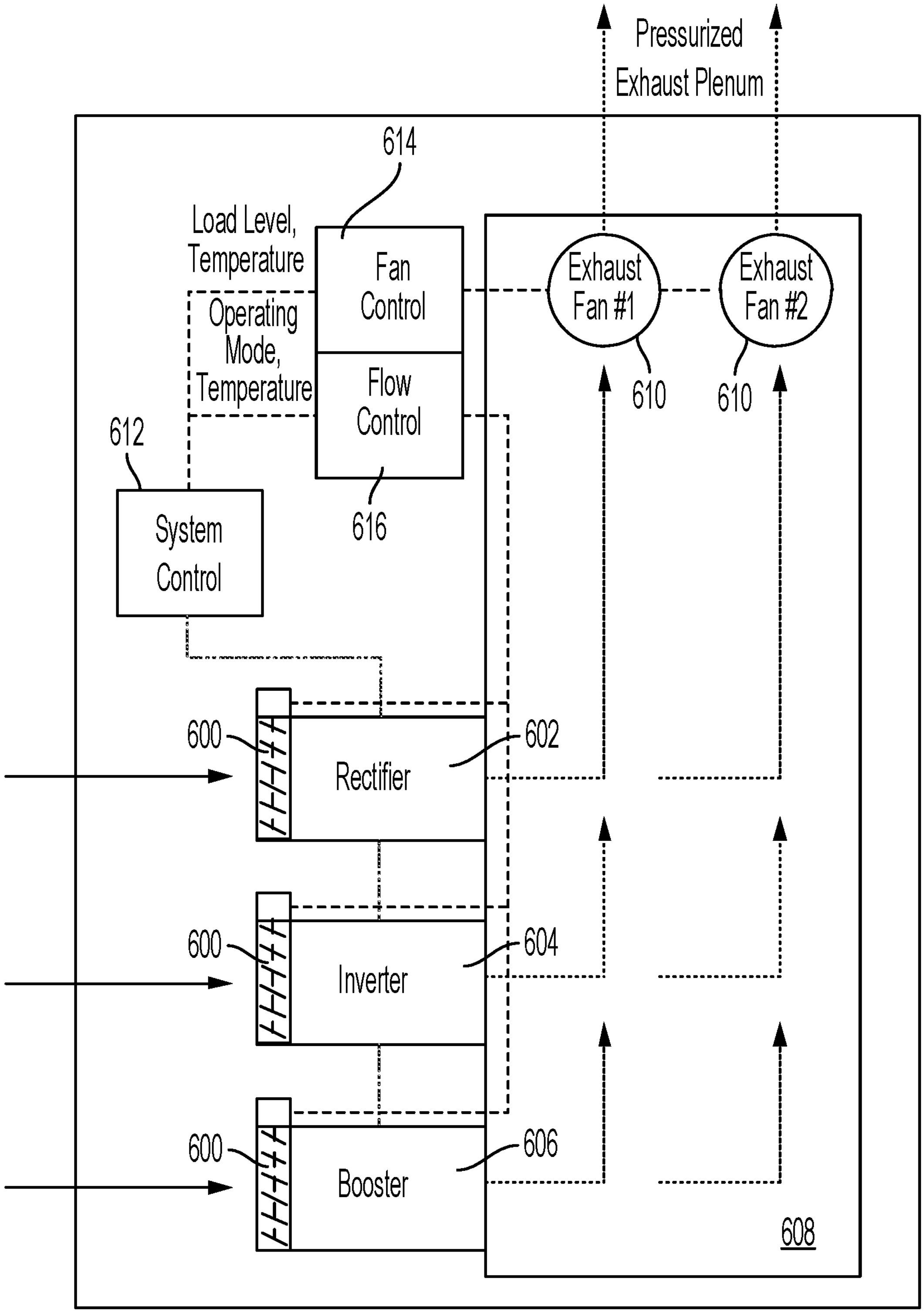
FIG. 6 illustrates an example architecture for controlled airflow cooling that includes a pressurized exhaust plenum, exhaust fans, and damper components of the cooling system with the functional blocks being connected to the pressurized exhaust plenum according to an embodiment of the present disclosure.

FIG. 6 illustrates an example architecture for controlled airflow cooling that includes a pressurized exhaust plenum, exhaust fans, and damper components of the cooling system with the functional blocks being connected to the pressurized exhaust plenum according to an embodiment of the present disclosure. The cooling system depicted in FIG. 6 is similar to the architecture presented in FIG. 5 but with the dampers 600 placed next to a component of the UPS (e.g., rectifier 602, inverter 604, and booster 606) and away from a wall of the pressurized exhaust plenum 608. The cooling system architecture depicted in FIG. 6 includes exhaust fans 610, system control 612, fan control 614, and flow control 616 which operate in a similar manner described above in FIG. 5. FIG. 6 depicts the functional blocks 602-606 being connected to or in communication with pressurized exhaust plenum 608. The functional blocks 602-606 may be connected or otherwise communicatively attached to a wall of the pressurized exhaust plenum 608. As used herein, components of a UPS, such as rectifier 602, inverter 604, and booster 606 may be referred to as functional blocks of the UPS.

Figure 7:
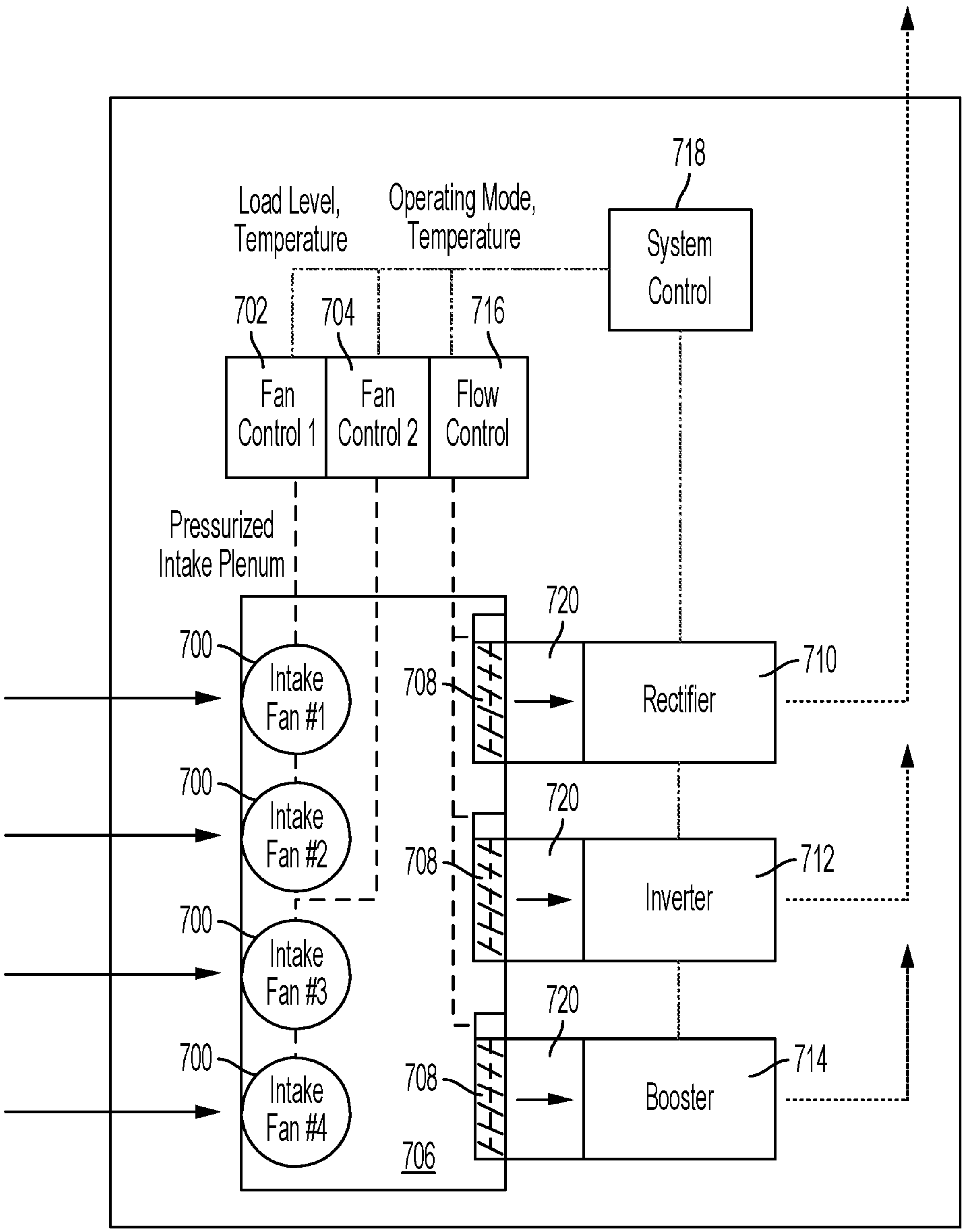
FIG. 7 illustrates an example architecture for controlled airflow cooling that includes a pressurized intake plenum, intake fans, and one or more fan control systems according to an embodiment of the present disclosure.

FIG. 7 illustrates an example architecture for controlled airflow cooling that includes a pressurized intake plenum, intake fans, and one or more fan control systems according to an embodiment of the present disclosure. The cooling system architecture depicted in FIG. 7 depicts multiple levels of redundancy through the use of one or more intake fans 700 and one or more fan control systems 702 and 704. The cooling system architecture of FIG. 7 includes a pressurized intake plenum 706, dampers 708, functional blocks 710-714 (e.g., rectifier 710, inverter 712, and booster 714), flow control 716, system control 718, and ducts 720. The cooling system architecture depicted in FIG. 7 may utilize a 2n redundant fan system where n=2 as illustrated.

The cooling system illustrated in FIG. 7 can suffer multiple failures of intake fans 700 (e.g., 2) while still providing adequate cool air flow to components 710-714, pressurized intake plenum 706, and dampers 708. Moreover, the intake fans 700 do not need to be associated with a specific component such as each fan being tied to a particular functional block (710-714). Instead, the intake fans 700 can provide adequate cool air to the pressurized intake plenum 706 which is directed towards the dampers 708, ducts 720, and functional blocks 710-714. Further redundancy is provided via the cooling system architecture depicted in FIG. 7 as fan control 702 may lock or fail to respond yet fan control 704 may still be configured to provide operating signals to intake fans 700 to continue the air flow of cool air to functional blocks 710-714. In embodiments, the cooling systems described herein can utilize one or more flow controls 716 to operate and update the dampers 708 and provide redundancy to the system in case one of the flow controls 716 fail to operate or cease communicating with dampers 708 and/or system control 718. It should be noted that although fan control(s) and flow control(s) depicted in the figures are separate from the system control(s), embodiments are not limited to such configurations. In some embodiments the functions of the fan control(s) and/or flow control(s) may be performed by the system control. In embodiments, the fan control(s) and/or flow control(s) may be components, modules, applications, or programs of the system control(s) and still provide redundancy for the novel cooling system described herein.

Figure 8:
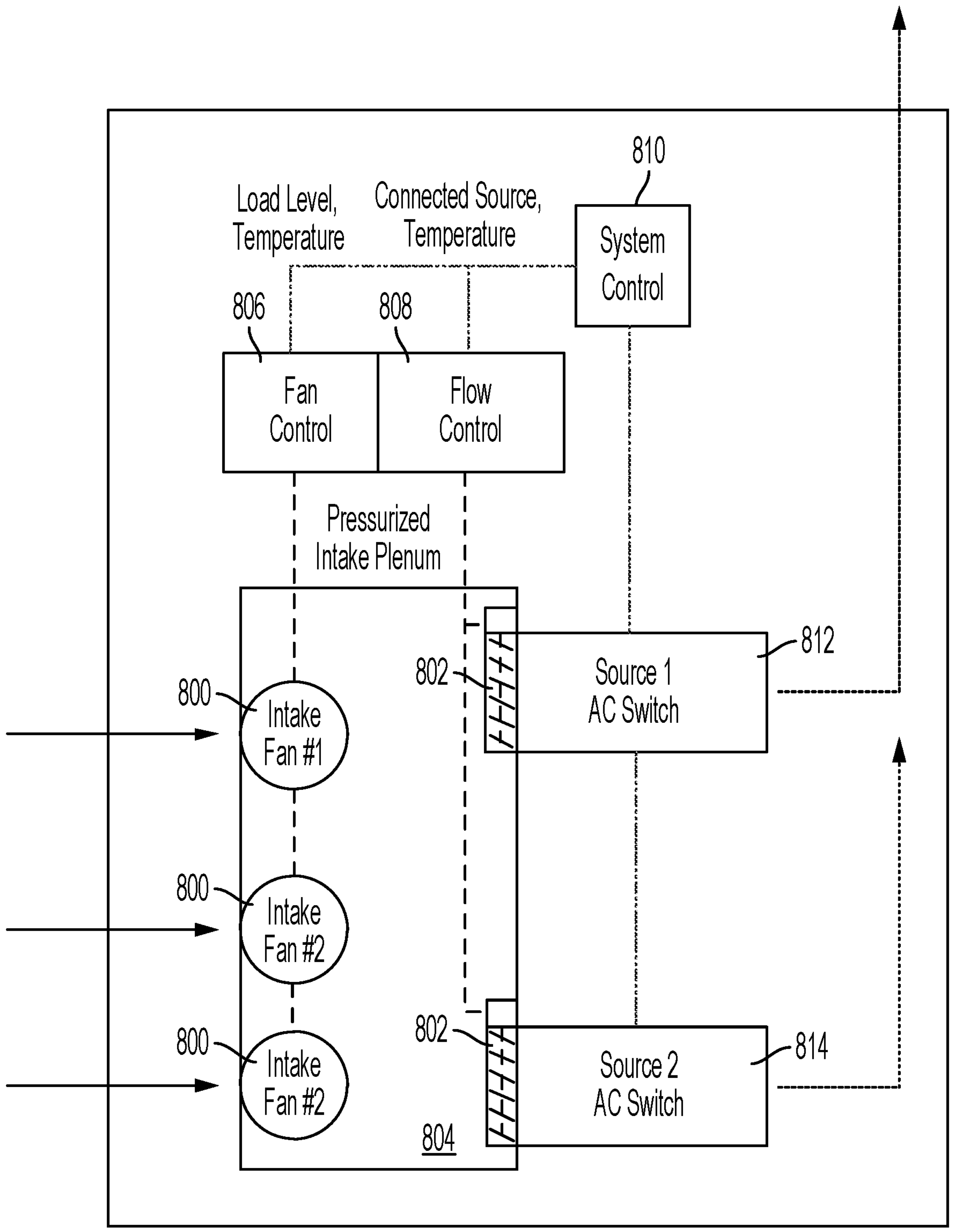
FIG. 8 illustrates an example architecture for controlled airflow cooling that includes a pressurized intake plenum and intake fans for interacting with power semiconductor switches according to an embodiment of the present disclosure.

FIG. 8 illustrates an example architecture for controlled airflow cooling that includes a pressurized intake plenum and intake fans for interacting with power semiconductor switches according to an embodiment of the present disclosure. As described herein, the cooling systems which provide controlled air flow cooling can be utilized with systems other than UPSs, such as semiconductor switches (e.g., STSs). FIG. 8 depicts a cooling system which includes intake fans 800, dampers 802, pressurized intake plenum 804, fan control 806, flow control 808, system control 810, and two source AC switches of the semiconductor switches (source 1 AC switch 812 and source 2 AC switch 814). Similar to cooling systems which are associated with or otherwise interact with UPS functional blocks, the cooling system depicted in FIG. 8 may provide cooling air flow to switches 812 and 814 via intake fans 800 forcing cool air into the pressurized intake plenum 804 and dampers 802 while forcing the hot or warm air out of switches 812 and 814.

Similar to the systems described in FIGS. 1-7, redundancy can be provided via the multiple intake fans 800, each of which is not associated with a particular switch 812 or 814, but instead provides cool air flow to the pressurized intake plenum 804 and dampers 802. In scenarios where the intake fans 800 or fan control 806 cease to communicate or lock in a certain operating mode (speed), the flow control 808 and system control 810 may respond by opening the dampers 802 to a greater degree than a current degree. In scenarios where the dampers 802 and/or flow control 808 cease to communicate or lock in a certain operating mode (open or closed to a certain degree), the fan control 806 and/or system control 810 can increase the fan speed of intake fans 800 to provide more cool air flow to pressurized intake plenum 804.

Figure 9:
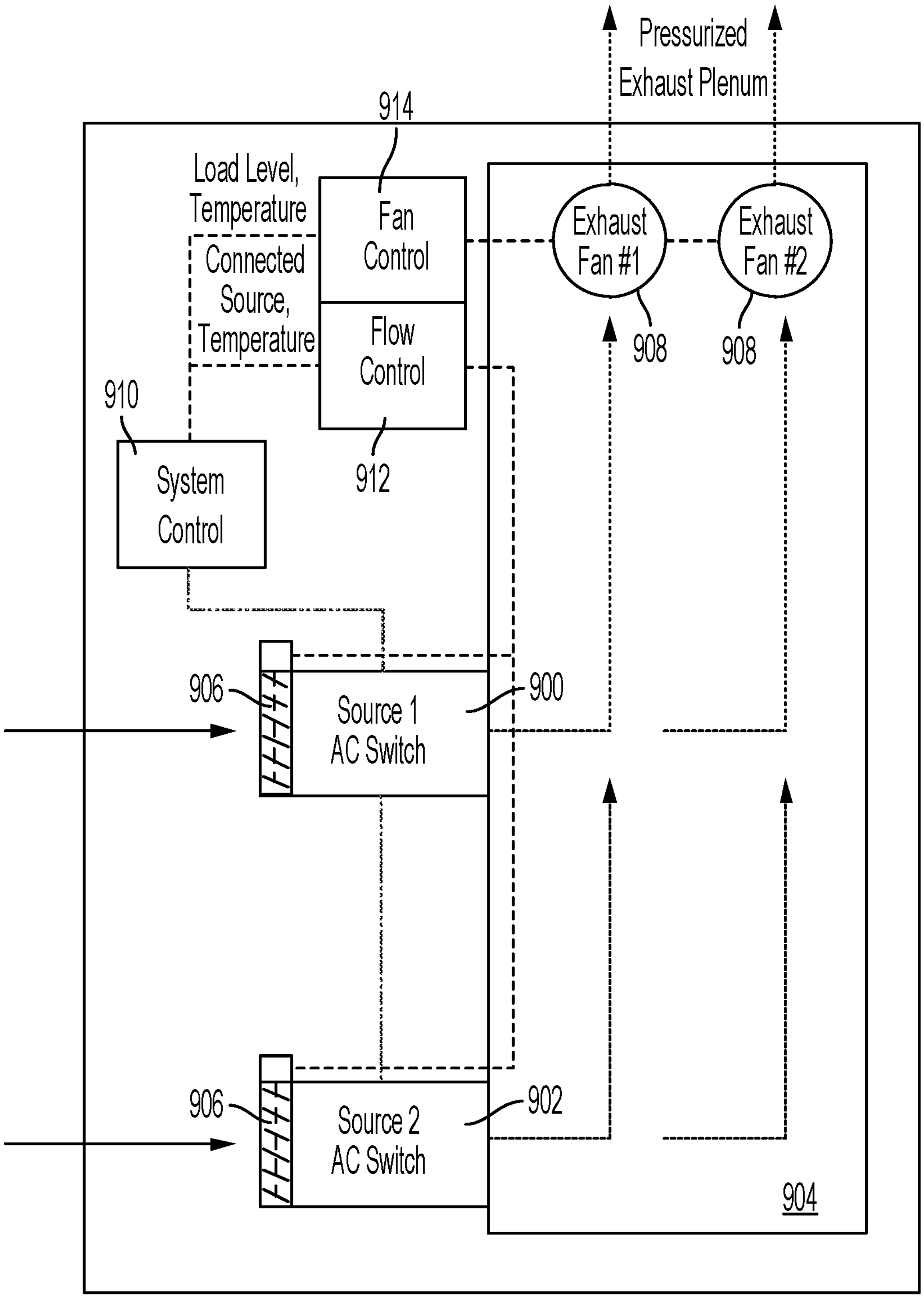
FIG. 9 illustrates an example architecture for controlled airflow cooling that includes a pressurized exhaust plenum and exhaust fans for interacting with power semiconductor switches according to an embodiment of the present disclosure.

FIG. 9 illustrates an example architecture for controlled airflow cooling that includes a pressurized exhaust plenum and exhaust fans for interacting with power semiconductor switches according to an embodiment of the present disclosure. The cooling system depicted in FIG. 9, similar to FIG. 8, connects to or is associated with a semiconductor switch such as source 1 AC switch 900 and source 2 AC switch 902. The cooling system of FIG. 9 includes the use of a pressurized exhaust plenum 904 to pull cool air flow through switches 900 and 902 via dampers 906 and exhaust fans 908, which force the warm or hot air out of the pressurized exhaust plenum 904. Similar to FIG. 8, the cooling system depicted in FIG. 9 includes system control 910, flow control 912, and fan control 914 for controlling dampers 906 and exhaust fans 908.

FIGS. 10*a* and 10*b* illustrate an example method or process for providing cooling using the controlled airflow cooling mechanisms described herein with a UPS as well as responding to failures in components of the cooling system according to an embodiment of the present disclosure. FIGS. 10*a* and 10*b* include an exemplary process 1000 which may be performed by an environment or architecture such as in FIGS. 2-9 and by systems and components such as, for example, system control 206, fan control 208, and/or flow control 226 interacting and communicating with intake fans 212, dampers 214-218, and pressurized intake plenum 210 of FIG. 2. However, it will be recognized that any of the following blocks may be performed in any suitable order and that the process 1000 may be performed in any environment or architecture and by any suitable computing device and/or controller.

At steps 1002 and 1004 the system control determines or otherwise receives signals indicating whether the UPS is in double conversion. In scenarios where the UPS is running in double conversion mode, the system control determines whether all fans are working at step 1006. If the fan control provides data or signals which indicate that all fans are working then the process 1000 continues to step 1008 where the system control determines whether the insulated-gate bipolar transistor (IGBT) temperature for the functional blocks of an associated UPS are within a certain threshold temperature range (e.g., normal operating temperature range). The IGBT temperature may be communicated to the system control via temperature sensors associated with each functional block, in embodiments. If any of the IGBT temperatures are not within a certain temperature range then the process 1000 continues by determining which functional block of the UPS is having an issue at 1010, 1012, and 1014.

The process 1000 includes responses that the system control, fan control, and/or flow control take in response to determining which functional block has an IGBT temperature that is outside of a threshold temperature range or based on a comparison of the IGBT temperature to one or more threshold temperatures. For example, at step 1016, in response to determining that the IGBT temperature is associated with an issue for a corresponding inverter, the process may include the system control, fan control, and flow control providing instructions to open certain dampers to certain positions (e.g., to certain degrees from a current degree of openness), and set the intake fans or exhaust fans to certain speeds (e.g., increase or decrease fan speeds). Similarly, at steps 1018 and 1020, the system control, fan control, and flow control may provide instructions for updating positions of dampers and changing the speeds of fans within the cooling system depending on whether the issue is associated with a rectifier (1012) or with both the rectifier and inverter (1014). At step 1022 if none of the issues are associated with a particular functional block yet the IGBT temperature indicates that the UPS or functional blocks of the UPS are operating at too high of a temperature, the system control, fan control, and/or flow control may switch to full throttle mode which increases the fan speeds to maximum speed and opens dampers to the maximum opening degree. The process 1000 includes step 1024 which sends an alarm to an event log in response to switching to full throttle operating mode at step 1022.

In response to the system control determining that the UPS is not in double conversion, the system control may determine whether the UPS is on the booster (e.g., drawing power from an associated battery) at step 1026 of process 1000. The process 1000 includes at step 1028 updating the dampers to certain positions and changing the speeds of the fans of the cooling system in response to the determination at step 1026 by signals or communications from the system control, fan control, and/or flow control. The process 1000 also includes step 1030 where the system control determines whether the UPS is on static bypass mode. If it is not on static bypass mode then the system control, fan control, and flow control switch to full throttle mode at 1022. Going back to step 1006, if the system control and/or fan control determine that not all fans are working within the cooling system, the process includes at steps 1032 and 1034 whether a certain fan or certain fans are not working. This can be in response to signals transmitted from the fans to fan control or directly from the fans to the system control. The process 1000 includes at steps 1036 and 1038 responses by the system control, fan control, and flow control to update the position of the dampers as well as change the speed of the remaining operating fans in the cooling system in response to determinations made at 1032 and 1034.

The process 1000 includes at step 1040 sending an alarm event to the log in response to determining that one of the fans in the cooling system is not operating or not communicating with the fan control and/or system control and taking one of the responses at steps 1036 and 1038. Referring back to step 1008 if the system control determines that the IGBT temperatures are okay for each functional block of the UPS, the process 1000 includes, at steps 1042, 1044, and 1046 the amount of load that the UPS is processing. Based on a determination of the load being processed by the UPS and associated functional blocks the process includes several responses to each load amount being processed at steps 1048, 1050, and 1052. Each response at steps 1048, 1050, and 1052 includes updates to the positions of dampers and changes to speeds of the fans of the associated cooling system, each of which is tailored to respond to the amount of load being processed by the UPS. The process 1000 includes an end step at step 1054. It should be noted that although process 1000 refers to components and steps taking by a cooling system associated with a UPS embodiments of the current disclosure are not limited to such systems. The cooling air flow system described herein may perform similar functions in an environment where the cooling system is associated with a semiconductor switch(es).

FIG. 11 illustrates an example process or method for providing cooling using the controlled airflow cooling mechanisms described herein with a UPS as well as responding to failures in components of the cooling system according to an embodiment of the present disclosure. FIG. 11 includes an exemplary process 1100 which may be performed by an environment or architecture such as in FIGS. 2-9 and by systems and components such as, for example, system control 206, fan control 208, and/or flow control 226 interacting and communicating with intake fans 212, dampers 214-218, and pressurized intake plenum 210 of FIG. 2. However, it will be recognized that any of the following blocks may be performed in any suitable order and that the process 1100 may be performed in any environment or architecture and by any suitable computing device and/or controller.

The process 1100 depicts the improved redundancy provided by the cooling system air flow described herein by including independent checks and operations for different components of a cooling system interacting with a UPS. At steps 1002 and 1004 the system control determines or otherwise receives signals indicating whether the UPS is in double conversion. It should be noted that although process 1100 refers to components and steps taken by a cooling system associated with a UPS, embodiments of the current disclosure are not limited to such systems. The cooling air flow system described herein may perform similar functions in an environment where the cooling system is associated with a semiconductor switch(es). Steps 1102 and 1104 of process 1100 begin by determining whether the fans of a cooling system are working. If the system control and/or fan control determines that the fans are not working at 1106 then the system control and/or fan control moves to failure handling 1108 which may involve changing the position of associated dampers and updating an operating speed of any remaining operating fans as described above with reference to FIG. 10.

If the system control and/or fan control determine that the fans are working at step 1104 then the process 1100 includes, at step 1110, setting the speeds of the fans of the cooling system based on an operating load of the associated UPS. The process 1100 includes a step for receiving or otherwise obtaining, by the system control, information or data which indicates the UPS load of the associated UPS which may include output, charging amount, grid support status, etc., at step 1112. Process 1100 includes an end step at 1114 for the speed control portion of the cooling system. Steps 1116 and 1118 of process 1100 begin by determining whether the dampers of the cooling system are working. Similar to the speed control steps 1102 and 1104, if the system control and/or flow control determine that the dampers are not working then the process 1100 continues to steps 1106 and 1108 with failure handling which may include changes to fan speeds and damper positions as well as generating alarms or updates to logs of errors for the cooling system.

Process 1100 includes, based on a determination that the dampers are working at step 1118, setting or updating damper positions of the cooling system based on a UPS operating mode at 1120. The process 1100 includes a table 1122 which represents certain positions for each damper that is associated with a different functional block of a UPS such as a rectifier, inverter, and booster. Based on the operating mode of the UPS, certain dampers may be opened more or less based on whether their corresponding functional block is under greater or less load strain in the UPS system operating in a certain UPS mode. In embodiments, the system control and/or flow control may update the positions of the dampers of a cooling system based on input derived from a table or predefined responses such as table 1122. Process 1100 includes an end step at 1124 for the flow control portion of the cooling system.

FIG. 12 illustrates a simplified block diagram of one or more devices or systems within exemplary cooling systems of FIGS. 1-11 according to embodiments of the present disclosure. FIG. 12 is a block diagram of an exemplary system or device 1200 within the system 1200 such as the system control 204, fan control 208, or flow control 226. The system 1200 includes a processor 1204, such as a central processing unit (CPU), and/or logic, that executes computer executable instructions for performing the functions, processes, and/or methods described herein. In some examples, the computer executable instructions are locally stored and accessed from a non-transitory computer readable medium, such as storage 1210, which may be a hard drive or flash drive. Read Only Memory (ROM) 1206 includes computer executable instructions for initializing the processor 1204, while the random-access memory (RAM) 1208 is the main memory for loading and processing instructions executed by the processor 1204. The network interface 1212 may connect to a wired network or cellular network and to a local area network or wide area network. The system 1200 may also include a bus 1202 that connects the processor 1204, ROM 1206, RAM 1208, storage 1210, and/or the network interface 1212. The components within the system 1200 may use the bus 1202 to communicate with each other. The components within the system 1200 are merely exemplary and might not be inclusive of every component within the system control 204, fan control 208, or flow control 226. Additionally, and/or alternatively, the system 1200 may further include components that might not be included within every entity of system control 204, fan control 208, or flow control 226. For instance, in some examples, the flow control 226 might not include a network interface 1212.

While the disclosure has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present disclosure covers further embodiments with any combination of features from different embodiments described above and below. Additionally, statements made herein characterizing the disclosure refer to an embodiment of the disclosure and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A controlled cooling system for one or more functional blocks of a power system, comprising:

two dampers each connected to at least one of the one or more functional blocks of the power system;

a pressurized intake plenum comprising one or more walls and one or more openings, each damper aligned with one of the one or more openings;

two intake fans in communication with the pressurized intake plenum and the one or more walls of the pressurized intake plenum;

a system control, wherein the two intake fans are configured to force cooling air through the pressurized intake plenum and the one or more functional blocks of the power system via the two dampers, a fan control system and a flow control system, wherein the fan control system is configured to communicate with each of the intake fans and control a current speed of each of the intake fans based on the signals between the two intake fans, the system control, and the fan control system;

wherein the flow control system is configured to communicate with each of the dampers and control a current position of each of the dampers based on the signals between the two dampers, the system control, and the flow control system;

wherein the system control, fan control system, and flow control system receive from one or more sensors associated with each of the intake fans, each of the dampers, or the one or more functional blocks of the power system an operating mode of the one or more functional blocks, a temperature associated with the one or more functional blocks, a load level of the one or more functional blocks, a current speed of each of the fans, and a current position of each of the dampers; and wherein the system control is configured to compare a temperature associated with at least one of the one or more functional blocks to a threshold temperature, and adjust a current position of at least one of the two dampers and send signals to the two intake fans to change a speed of the two intake fans based on the temperature exceeding the threshold temperature.

2. The controlled cooling system of claim 1, wherein the system control or the flow control system update the current position of each of the dampers to a greater degree of opening in response to the signals from the fan control system indicating a failure of one of the two intake fans or in response to the signals from the flow control system indicating a failure of one of the two dampers.

3. The controlled cooling system of claim 1, wherein the system control or the flow control system update the current position of one of the two dampers to a greater degree of opening in response to not receiving the signals from the fan control system.

4. The controlled cooling system of claim 1, wherein the system control or the fan control system update the current speed of the two intake fans to increase the speed of the two intake fans in response to the signals from the flow control system indicating a failure of one of the two dampers or in response to the signals from the fan control system indicating a failure of one of the two intake fans.

5. The controlled cooling system of claim 1, wherein the system control or the fan control system update the current speed of the two intake fans to increase the speed of the two intake fans in response to not receiving the signals from the flow control system.

6. A controlled cooling system for one or more functional blocks of a power system, comprising:

the power system, wherein the power system is an uninterruptible power system (UPS), and wherein the one or more functional blocks include at least a rectifier, an inverter, and a booster;

two dampers each connected to at least one of the one or more functional blocks of the power system;

a pressurized intake plenum comprising one or more walls and one or more openings, each damper aligned with one of the one or more openings;

two intake fans in communication with the pressurized intake plenum and the one or more walls of the pressurized intake plenum; and a system control, wherein the two intake fans are configured to force cooling air through the pressurized intake plenum and the one or more functional blocks of the power system via the two dampers;

wherein the system control is configured to compare a temperature associated with at least one of the one or more functional blocks to a threshold temperature, and adjust a current position of at least one of the two dampers and send signals to the two intake fans to change a speed of the two intake fans based on the temperature exceeding the threshold temperature.

7. The controlled cooling system of claim 1, further comprising one or more ducts in communication with each of the dampers and the one or more functional blocks, the one or more ducts located in between each of the dampers and the one or more functional blocks.

8. The controlled cooling system of claim 1, further comprising one or more ducts in communication with each of the dampers and the pressurized intake plenum, the one or more ducts located in between each of the dampers and the pressurized intake plenum.

9. A controlled cooling system for one or more functional blocks of a power system, comprising:

two dampers each connected to at least one of the one or more functional blocks of the power system;

a pressurized intake plenum comprising one or more walls and one or more openings, each damper aligned with one of the one or more openings;

two intake fans in communication with the pressurized intake plenum and the one or more walls of the pressurized intake plenum; and a system control, wherein the two intake fans are configured to force cooling air through the pressurized intake plenum and the one or more functional blocks of the power system via the two dampers, wherein the system control is configured to compare a temperature associated with at least one of the one or more functional blocks to a threshold temperature, and adjust a current position of at least one of the two dampers and send signals to the two intake fans to change a speed of the two intake fans based on the temperature exceeding the threshold temperature wherein the controlled cooling system further comprises one or more fan control systems and one or more flow control systems, wherein the one or more fan control systems are configured to communicate with each of the intake fans and control a current speed of the two intake fans based on the signals between each of the intake fans, the system control, and the one or more fan control systems, and wherein the system control is configured to compare a temperature associated with at least one of the one or more functional blocks to a threshold temperature, and adjust a current position of at least one of the two dampers and send signals to the two intake fans to change a speed of the two intake fans based on the temperature exceeding the threshold temperature, wherein the fan control system and flow control system are configured to operate independently of each other and dynamically adjust airflow and damper positions based on real-time feedback from sensors located within the functional blocks.

10. The controlled cooling system of claim 9, wherein the one or more flow control systems are configured to communicate with each of the dampers, wherein the one or more flow control systems are configured to communicate with each of the dampers and control a current position of the two dampers based on the signals between each of the dampers, the system control, and the one or more flow control systems.

11. A controlled cooling system for one or more functional blocks of a power system, comprising:

two dampers each connected to at least one of the one or more functional blocks of the power system;

a pressurized exhaust plenum comprising one or more walls and one or more openings, each damper aligned with one of the one or more openings;

two exhaust fans in communication with the pressurized exhaust plenum and the one or more walls of the pressurized exhaust plenum; and a system control, wherein the two exhaust fans are configured to pull cooling air through the pressurized exhaust plenum and the one or more functional blocks of the power system via the two dampers, and force warm air out of the pressurized exhaust plenum, a fan control system and a flow control system, wherein the fan control system is configured to communicate with each of the exhaust fans and control a current speed of the two exhaust fans based on the signals between each of the exhaust fans, the system control, and the fan control system;

wherein the flow control system is configured to communicate with each of the dampers, wherein the flow control system is configured to communicate with each of the dampers and control a current position of each of the dampers based on the signals between each of the dampers, the system control, and the flow control system; and the power system, wherein the power system is a static transfer switch (STS), and wherein the one or more functional blocks include a source alternating current (AC) switch;

wherein the system control is configured to compare a temperature associated with at least one of the one or more functional blocks to a threshold temperature, and adjust a current position of at least one of the two dampers and send signals to the two exhaust fans to change a speed of the two exhaust fans based on the temperature exceeding the threshold temperature.

12. The controlled cooling system of claim 11, further comprising one or more ducts in communication with each of the dampers and the one or more functional blocks, the one or more ducts located in between each of the dampers and the one or more functional blocks.

13. The controlled cooling system of claim 11, further comprising one or more ducts in communication with each of the dampers and the pressurized exhaust plenum, the one or more ducts located in between each of the dampers and the pressurized exhaust plenum.

14. A computer-implemented method, comprising:

receiving, by a control system of a power system, signals from a fan control system and a flow control system, the control system configured to communicate with two intake fans and two dampers, the two intake fans in communication with a pressurized intake plenum, the pressurized intake plenum comprising one or more walls and one or more openings, each one of the two dampers connected to at least one of one or more functional blocks and aligned with the one or more openings, wherein the two intake fans are configured to force cooling air through the pressurized intake plenum and the one or more functional blocks of the power system via the wo dampers;

comparing, by the control system, a temperature included in the signals to a threshold temperature; and adjusting, by the control system via instructions transmitted to the fan control system and the flow control system, a current speed of the two intake fans and a current position of at least one of the two dampers based on the temperature exceeding the threshold temperature, and updating the current position of at least one of the two dampers to a greater degree of opening in response to not receiving the signals from the fan control system.

* * * * *